United States Patent
Han (10) Patent No.: US 12,181,511 B2
(45) Date of Patent: Dec. 31, 2024

(54) METHOD AND DEVICE FOR TESTING WAFER, ELECTRONIC DEVICE AND STORAGE MEDIUM

(71) Applicant: Saimeite Technology Co., Ltd., Jiangsu (CN)

(72) Inventor: Lincheng Han, Jiangsu (CN)

(73) Assignee: Saimeite Technology Co., Ltd., Jiangsu (CN)

(*) Notice: Subject to any disclaimer, the term of this patent is extended or adjusted under 35 U.S.C. 154(b) by 84 days.

(21) Appl. No.: 17/899,274

(22) Filed: Aug. 30, 2022

(65) Prior Publication Data

US 2023/0213573 A1 Jul. 6, 2023

(30) Foreign Application Priority Data

Dec. 29, 2021 (CN) .......................... 202111643575.1

(51) Int. Cl.
*G01R 31/26* (2020.01)

(52) U.S. Cl.
CPC ................. *G01R 31/2601* (2013.01)

(58) Field of Classification Search
CPC ............ G01R 31/2601; G01R 31/2648; G01R 31/01; G05B 19/41875; G05B 2219/32368; G05B 19/41865; G05B 2219/32283; G05B 2219/32315; G05B 2219/45031; G06F 9/4881; G06F 30/30; G06F 30/398; G06F 9/5011; G06F 9/5027; G06F 9/5083; G06F 30/20; G06F 30/337; G06F 30/373; G06F 9/485; G06F 16/119; G06F 16/16;

(Continued)

(56) References Cited

U.S. PATENT DOCUMENTS

| 4,875,002 A | 10/1989 | Sakamoto et al. |
| 5,787,190 A | 7/1998 | Peng et al. |

(Continued)

FOREIGN PATENT DOCUMENTS

| CN | 103413771 A | 11/2013 |
| CN | 108227508 A | 6/2018 |

(Continued)

OTHER PUBLICATIONS

Espacenet English translation CN 109741027A A (Year: 2019).*

(Continued)

*Primary Examiner* — Alexander Satanovsky
*Assistant Examiner* — Courtney G McDonnough
(74) *Attorney, Agent, or Firm* — Davis Wright Tremaine LLP (57) ABSTRACT

The present disclosure provides a method and a device for testing a wafer, an electronic device, and storage medium, wherein the method includes: obtaining plural test sheets; dividing the wafers to be tested in the plurality of test sheets according to individual test items in the plurality of test sheets, and determining the wafers to be tested corresponding to individual divided units; determining a test sequence of the test items to be performed on each wafer to be tested, based on a test sequence condition of the test items in individual test sheets and a test condition of a testing machine corresponding to individual divided units; and (Continued)

testing the wafer to be tested, according to the test sequence of the test items to be performed on any of the wafers to be tested.

8 Claims, 4 Drawing Sheets

(58) Field of Classification Search
CPC .. G06F 16/1744; G06F 16/2282; G06F 16/27; G06F 16/285; G06F 16/958; G06F 17/18; G06F 30/31; G06F 30/39; G06F 8/20; G06F 8/36; G06F 8/38; H04L 9/50; G06Q 10/103; G06Q 10/063112; G06Q 10/063118; G06Q 50/04; G06Q 10/06; G06Q 40/04
USPC .................................................. 324/762.05
See application file for complete search history.

(56) References Cited

U.S. PATENT DOCUMENTS

| | | | |
|---|---|---|---|
| 6,070,130 | A | 5/2000 | Gutmann et al. |
| 6,507,800 | B1 | 1/2003 | Sheu |
| 2004/0115842 | A1* | 6/2004 | Liu .................. G05B 19/41865 438/14 |
| 2007/0007521 | A1 | 1/2007 | Yoshimatsu |

FOREIGN PATENT DOCUMENTS

| | | | | |
|---|---|---|---|---|
| CN | 109741027 | A | * 5/2019 | .............. Y02P 90/30 |
| CN | 110888036 | A | 3/2020 | |
| CN | 112285525 | A | 1/2021 | |
| CN | 113047531 | A | 6/2021 | |
| CN | 113049935 | A | 6/2021 | |
| CN | 113743912 | A | 12/2021 | |
| JP | 2006267056 | A | 10/2006 | |
| KR | 20000056483 | A | 9/2000 | |
| TW | 200536033 | A | 11/2005 | |

OTHER PUBLICATIONS

The State Intellectual Property Office of People's Republic of China, "First Office Action" in Application No. 202111643575.1, (with English Translation) Aug. 22, 2022, 7 pages.

The State Intellectual Property Office of People's Republic of China, "Notification to Grant Patent Right for Invention" in Application No. 202111643575.1, (with English Translation) Oct. 20, 2022, 3 pages.

The State Intellectual Property Office of People's Republic of China, "First Search Document" in Application No. 202111643575.1, Aug. 22, 2022, 1 page.

* cited by examiner

METHOD AND DEVICE FOR TESTING WAFER, ELECTRONIC DEVICE AND STORAGE MEDIUM

CROSS-REFERENCE TO RELATED APPLICATIONS

This application claims priority to Chinese Patent Application No. 202111643575.1, filed Dec. 29, 2021, entitled "METHOD AND DEVICE FOR TESTING WAFER, ELECTRONIC DEVICE AND STORAGE MEDIUM," the disclosure of which is hereby incorporated herein in its entirety.

TECHNICAL FIELD

The present disclosure relates to the technical field of semiconductor production, and in particular, to a method and a device for testing a wafer, an electronic device, and storage medium.

BACKGROUND ART

With development of science and technology, semiconductors, as basic raw material of hardware in the development of science and technology, have gradually become more and more important. In production of semiconductors, the wafer needs to be processed first. During wafer processing, processing processes, such as cleaning, oxidation, photolithography and others, are involved. During this processing process, a user generates Runcard test sheet for the wafer in the production process, such that the wafer in the production process is made to jump out of the production process to carry out the test process set by the user. Each Runcard test sheet has test steps. In the prior art, when testing the wafer, each wafer is tested according to the test sequence on the Runcard test sheet.

However, due to the situation that plural wafers are tested in the same test step, the Runcard test sheet records individual test steps, if the wafers are tested only according to the test sequence on the Runcard test sheet, if one machine is turned on for one wafer, not only it will lead to the waste of the testing machines, but also a longer test time is caused, and at the same time, the efficiency of testing wafers is low as well.

SUMMARY

Embodiments of the present disclosure provide at least a wafer testing method, a device, an electronic device, and a storage medium. In this way, by arranging a better test sequence for the test items corresponding to individual wafers to be tested, the efficiency of testing individual wafers can be improved.

Embodiments of the present disclosure provide a method for testing a wafer, the method comprising steps of:
obtaining plural test sheets, wherein each test sheet corresponds to at least one wafer to be tested and plural test items;
dividing the wafers to be tested in the plural test sheets according to individual test items in the plural test sheets, and determining the wafers to be tested corresponding to individual divided units, wherein the test items of the wafers to be tested corresponding to a same divided unit are the same;
determining a test sequence of the test items to be performed on each wafer to be tested, based on a test sequence condition of the test items in individual test sheets and a test condition of a testing machine corresponding to individual divided units; and
testing the wafer to be tested, according to the test sequence of the test items to be performed on any of the wafers to be tested.

In an optional embodiment, any of the test sheets is generated in following manner:
obtaining batch information and test main process information of the wafer to be tested corresponding to any production batch;
obtaining site information of a test sheet, wafer identifier of the wafer to be tested in the test sheet, and a test item of the test sheet, set by an user, according to the batch information and the test main process information; and
generating the test sheet of the wafer to be tested corresponding to the production batch, according to the site information, the wafer identifier and the test item corresponding to the production batch.

In an optional embodiment, the step of dividing the wafers to be tested in the plural test sheets according to individual test items in the plural test sheets, and determining the wafers to be tested corresponding to individual divided units comprises:
determining the wafers to be tested in the plural test sheets corresponding to the item identifier, according to the item identifier of any test item; and
dividing the wafers to be tested corresponding to each test item into a same unit.

In an optional embodiment, the test sequence condition comprises: a site priority of a test item, and a creation time priority of individual test sheets, and the test condition comprises: machine amount, machine type, machine idle time; and the step of determining a test sequence of the test items to be performed on each wafer to be tested based on a test sequence condition of the test items in individual test sheets and a test condition of a testing machine corresponding to individual divided units comprises:
using a sorting function to generate a test sequence of the test items of each wafer to be tested, according to the site priority of the test items in individual test sheets, the creation time priority of individual test sheets, and the machine amount, the machine type and the machine idle time of testing machines corresponding to individual batches.

In an optional embodiment, the step of testing the wafer to be tested according to the test sequence of the test items to be performed on any of the wafers to be tested comprises:
arranging sequentially the wafers to be tested to a testing machine corresponding to the test item for being tested, according to the test sequence of the test items of any of wafers to be tested.

In an optional embodiment, the method further comprises:
making the wafers to be tested batched into a wafer group corresponding to a generated batch, if the testing of any wafer to be tested is complete.

The embodiment of the present disclosure provides a device for testing a wafer, the device comprising:
an obtaining module, configured for obtaining plural test sheets, wherein each test sheet corresponds to at least one wafer to be tested and plural test items;
a division module, configured for dividing the wafers to be tested in the plural test sheets according to individual test items in the plural test sheets, and determining the wafers to be tested corresponding to individual divided units, wherein the test items of the wafers to be tested corresponding to a same divided unit are the same;

a determining module, configured for determining a test sequence of the test items to be performed on each wafer to be tested, based on a test sequence condition of the test items in individual test sheets and a test condition of a testing machine corresponding to individual divided units; and a testing module, configured for testing the wafer to be tested, according to the test sequence of the test items to be performed on any of the wafers to be tested.

In an optional embodiment, the obtaining module generates any test sheet in following manner:

obtaining batch information and test main process information of the wafer to be tested corresponding to any production batch;

obtaining site information of a test sheet, wafer identifier of the wafer to be tested in the test sheet, and a test item of the test sheet, set by an user, according to the batch information and the test main process information; and generating the test sheet of the wafer to be tested corresponding to the production batch, according to the site information, the wafer identifier and the test item corresponding to the production batch.

In an optional embodiment, the division module is specifically configured for:

determining the wafers to be tested in the plural test sheets corresponding to the item identifier, according to the item identifier of any test item; and dividing the wafers to be tested corresponding to each test item, into a same unit.

In an optional embodiment, the test sequence condition comprises: a site priority of the test item, and a creation time priority of individual test sheets, and the test condition comprises: the machine amount, the machine type, and the machine idle time; and the determining module is specifically configured for:

using a sorting function to generate a test sequence of the test items of each wafer to be tested, according to the site priority of the test items in individual test sheets, the creation time priority of individual test sheets, and the machine amount, the machine type and the machine idle time of testing machines corresponding to individual batches.

In an optional embodiment, the testing module is specifically configured for:

arranging sequentially the wafers to be tested to a testing machine corresponding to the test item for being tested, according to the test sequence of the test items of any of wafers to be tested.

In an optional embodiment, the device further comprises a batching module, which is configured for:

making the wafer to be tested batched into a wafer group corresponding to a generated batch, if the testing of any wafer to be tested is complete.

Embodiments of the present disclosure further provide an electronic device, comprising: a processor, a memory, and a bus, wherein the memory stores machine-readable instructions executable by the processor, wherein when the electronic device is running, the processor and the memory communicate with each other through the bus, and the machine-readable instructions, when being executed by the processor, perform steps in the embodiment above.

Embodiments of the present disclosure further provide computer storage medium, wherein a computer program is stored on the computer storage medium, and the computer program, when being run by a processor, executes steps in the embodiment above.

Embodiments of the present disclosure provide a method and a device for testing a wafer, an electronic device, and storage medium, wherein the method comprises: obtaining plural test sheets: dividing the wafers to be tested in the plurality of test sheets according to individual test items in the plurality of test sheets, and determining the wafers to be tested corresponding to individual divided units: determining a test sequence of the test items to be performed on each wafer to be tested, based on a test sequence condition of the test items in individual test sheets and a test condition of a testing machine corresponding to individual divided units; and testing the wafer to be tested, according to the test sequence of the test items to be performed on any of the wafers to be tested. In this way, by arranging a better test sequence for the test items corresponding to individual wafer to be tested, the test efficiency of individual wafers can be improved.

Further, in the method for testing a wafer provided by the embodiments of the present disclosure, it is also possible that if the testing of any wafer to be tested is complete, the wafers to be tested are batched into the wafer group corresponding to the generated batch, such that the wafers having been tested are batched into one batch to ensure the integrity of wafers of the same batch.

In order to make the above-mentioned objects, features and advantages of the present disclosure more obvious and easy to be understood, the preferred embodiments are exemplified below, and are described in detail in conjunction with the drawings as follows.

BRIEF DESCRIPTION OF DRAWINGS

In order to explain the technical solutions of the embodiments of the present disclosure more clearly, the drawings required in the embodiments will be briefly introduced below, with the drawings incorporated into the specification and constituting a part of the specification. The drawings illustrate embodiments consistent with the present disclosure, and are used, together with the specification, for explaining the technical solutions of the present disclosure. It should be understood that the following drawings only show some of the embodiments of the present disclosure, and therefore should not be regarded as limiting the scope. As for one skilled in the art, other related drawings can be obtained from these drawings.

REFERENCE SIGNS

300—device for testing a wafer (wafer testing device), 310—obtaining module, 320—division module, 330—determining module, 340—testing module, 350—batching module, 500—electronic device, 510—processor, 520—memory, 521—internal memory, 522—external memory, 530—bus.

DETAILED DESCRIPTION OF EMBODIMENTS

In order to make the purposes, technical solutions and advantages of the embodiments of the present disclosure more clear, the technical solutions in the embodiments of the present disclosure will be clearly and completely described below with reference to the drawings in the embodiments of the present disclosure. Obviously, the described embodiments are only part, but not all, of the embodiments of the present disclosure. Generally, the components of the disclosed embodiments shown and illustrated in the drawings herein may be arranged and designed in a variety of different configurations. Therefore, the following detailed description on the embodiments of the present disclosure provided in the drawings is not intended to limit the scope of the present disclosure as claimed, but is merely representative of selected embodiments of the present disclosure. Based on the embodiments of the present disclosure, all other embodiments, obtained by those skilled in the art without creative work, fall within the protection scope of the present disclosure.

It should be noted that like numerals and letters refer to like items in the following drawings, so that once an item is defined in one drawing, it is not required to further define and explain it in subsequent drawings.

The term "and/or" here only describes an association relationship, which means that there may be three kinds of relationships, for example, A and/or B, which can mean three situations: the existence of A alone, the existence of A and B at the same time, the existence of B alone. In addition, the term "at least one" herein refers to any one of the plurality or any combination of at least two of the plurality. For example, "comprising at least one of A, B, and C" may mean comprising any one or more elements selected from the set consisting of A, B, and C.

It has been found from research that, with the development of science and technology, semiconductors are gradually becoming more and more important, as the basic raw materials of hardware in the development of science and technology. In the semiconductor manufacturing process, for research and development experiments, process parameter adjustment, or process condition modification required by customers, IC Foundry will generate a Runcard test sheet in paper form to describe the corresponding information in detail, such as the semiconductor equipment serial number, amount of wafers, wafer serial number, process recipe, or reticle used for experiments.

The manufacturing execution system (MES) can set a Runcard test sheet of electronic version to record relevant information, but currently no method for testing a wafer based on the Runcard test sheet of electronic version is available.

Based on the above research, the present disclosure provides a method and a device for testing a wafer, an electronic device, and storage medium, wherein the method comprises: obtaining a plurality of test sheets: dividing the wafers to be tested in the plurality of test sheets according to individual test items in the plurality of test sheets, and determining the wafers to be tested corresponding to individual divided units: determining a test sequence of the test items to be performed on each wafer to be tested, based on a test sequence condition of the test items in individual test sheets and a test condition of a testing machine corresponding to individual divided units; and testing the wafer to be tested, according to the test sequence of the test items to be performed on any of the wafers to be tested. In this way, by arranging a better test sequence for the test items corresponding to individual wafers to be tested, the test efficiency of individual wafers can be improved.

MES (manufacturing execution system) is a set of production information management system for the workshop execution layer of manufacturing enterprises. MES can provide enterprises with management modules comprising manufacturing data management, plan scheduling management, production dispatching management, inventory management, quality management, human resource management, work center/equipment management, tool and laborsuit management, procurement management, cost management, project chalkboard management, production process control, bottom-level data integration analysis, and upper-level data integration and decomposition, etc., which creates a solid, reliable, comprehensive and feasible manufacturing collaborative management platform for enterprises.

In order to facilitate the understanding of this embodiment, a method for testing a wafer disclosed in the embodiment of the present disclosure is first introduced in detail. The execution subject of the method for testing a wafer provided by the embodiment of the present disclosure is generally a computer device with a certain computing capability. The computer device comprises, for example: terminal device or server or other processing equipment. The terminal device can be user equipment (user equipment, UE), mobile equipment, user terminal, terminal, cellular phone, cordless phone, personal digital assistant (PDA), handheld devices, computing devices, in-vehicle devices, wearable devices, etc. In some possible embodiments, the method for testing a wafer may be implemented by a processor invoking computer-readable instructions stored in a memory.

Figure 1:
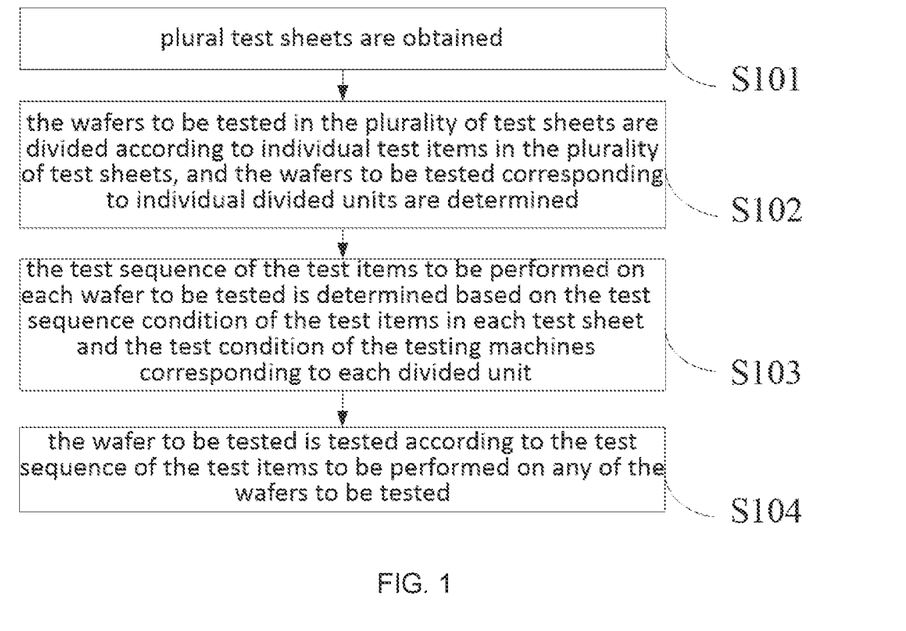
FIG. 1 shows a flowchart of the method for testing a wafer provided by an embodiment of the present disclosure.

Referring to FIG. 1, which is a flowchart of a method for testing a wafer provided by an embodiment of the present disclosure, the method comprises Steps S101-S104.

In S101, plural test sheets are obtained.

Here, the test sheet refers to an electronic form (sheet) used to describe the corresponding information during the process of manufacturing semiconductor, for research and development experiments, process parameter adjustment, or process condition modification required by customers, wherein each test sheet corresponds to at least one wafer to be tested and plural test items.

Further, in an optional embodiment, any test sheet is generated in the following manner:

obtaining batch information and test main process information of the wafer to be tested corresponding to any production batch;

obtaining site information of a test sheet, wafer identifier of the wafer to be tested in the test sheet, and a test items of the test sheet, set by an user, according to the batch information and the test main process information; and generating the test sheet of the wafer to be tested corresponding to the production batch, according to the site information, the wafer identifier and the test items corresponding to the production batch.

In this step, the batch information and test main process information of the wafer to be tested corresponding to any production batch are obtained from the data base by calling function; and through the display page, the batch information and the test main process information are displayed on the display page, to be set by an user. The site information of the test, which is set by the user according to the step identifier in the test main process, the wafer identifier, which is selected by the user from the wafer identifiers in the batch information as the wafer to be tested in the test sheet, and the test items, which are set by the user for the site information and the wafer to be tested, are obtained, and then a test sheet for the wafer to be tested corresponding to the production batch is generated according to the site information, wafer identifier and test items corresponding to the production batch.

Herein, the batch information of the wafers to be tested may comprise: batch identifier, wafer identifier, wafer amount, etc. Each test main process comprises plural process steps, and each process step has one step identifier and the step description information. The test main process information can comprise the main process identifier, step identifier, amount of steps, step description information, etc. The site is set by the user and used to jump from the main process of wafer production to the node in the test sheet process, which can specifically comprise a starting site and an ending site. The site carries site information, comprising site identifier, site serial number, site description information, etc. The test item is the test process which is set by the user according to the selected wafer to be tested and requirements. Each test sheet can comprise at least one test item, and the information carried by each test item may comprise: test item serial number, test item identifier, test item description information, process sequence identifier, etc.

In addition, when generating a test item, it is possible to set the test time of the test item.

Exemplarily, according to the batch information with the batch identifier of A800019, the wafer identifier of 3 wafers selected by the user to be tested are obtained as 01, 03, and 05. Then, according to the step identifier in the main process information with the main process identifier of HANDLE-TEST-T, the site selected by the user is obtained, wherein the starting site identifier is TNOtest 006, the ending site identifier is TNOtest 006. Then, according to the wafer identifier of the wafer and user requirements, the test item information, the synthesize wafer identifier, the step identifier, and the test item information of the test sheet are set, to generate a test sheet for wafers with the batch identifier of A800019.

In S102, the wafers to be tested in the plurality of test sheets are divided according to individual test items in the plurality of test sheets, and the wafers to be tested corresponding to individual divided units are determined.

Here, each test sheet corresponds to a plurality of test items, and each test item corresponds to at least one wafer to be tested.

Exemplarily, the test sheet with the test sheet identifier of RC20211208012 comprises the test item with the test item serial number 001, and the wafer identifiers of the wafers to be tested corresponding to the test item are 02, 03, and 05.

Further, in an optional embodiment, the step of dividing the wafers to be tested in the plurality of test sheets according to individual test items in the plurality of test sheets and determining the wafers to be tested corresponding to individual divided units comprises:

determining the wafers to be tested in the plural test sheets corresponding to the item identifier, according to the item identifier of any test item; and dividing the wafers to be tested corresponding to each test item, into a same unit.

In this step, all the wafers to be tested are traversed according to the item identifier of any test item, the wafers to be tested with the item identifier are found, and the wafers to be tested with the same item identifier are divided into the same unit.

Exemplarily, there are two test sheets with the test sheet identifiers of RC20211208012 and RC20211208013. The test sheet with the test sheet identifier of RC20211208012 comprises the test item with the test item identifier of 001, and the wafers to be tested corresponding to the 001 test item have the wafer identifiers of 01 and 02. The test sheet with the test sheet identifier of RC20211208013 comprises the test item with the test item identifier of 002, and the wafers to be tested corresponding to the test item have the wafer identifiers of 03 and 05. They are divided according to the item identifier and the identifier of the corresponding wafer to be tested, to obtain the wafers to be tested with the identifiers of 01 and 02 corresponding to the test item identifier of 001, as a unit, and with the identifiers of 03 and 05 corresponding to the test item identifier of 002, as a unit.

In S103, the test sequence of the test items to be performed on each wafer to be tested is determined based on the test sequence condition of the test items in each test sheet and the test condition of the testing machines corresponding to each divided unit.

Here, when the wafer to be tested is tested according to the test sheet, problems may happen, i.e., the time periods of plural test items corresponding to the same wafer to be tested overlap with each other, which may cause that the test is unable to be carried out: if the time periods of plural wafers to be tested corresponding to one test item do not overlap, which causes a test problem: when the test is carried out only according to the test items on the test sheet, if one machine is turned on for one wafer, it will not only lead to a waste of the testing machine, but also lead to longer test time; and at the same time, the wafer test efficiency is also low, etc. In order to avoid the above problems, according to the test sequence condition of the test items in individual test sheets and the test condition of the testing machine corresponding to individual divided units, the test sequence of the test items to be performed on each wafer to be tested is calculated, to generate the optimal test sequence according to the comprehensive conditions.

Further, in an optional embodiment, the test sequence condition comprises: the site priority of the test item, and the creation time priority of individual test sheets, and the test condition comprises: the machine amount, the machine type, the machine idle time; and the step of determining a test sequence of the test items to be performed on each wafer to be tested based on a test sequence condition of the test items in individual test sheets and a test condition of a testing machine corresponding to individual divided units comprises:

using a sorting function to generate a test sequence of the test items of each wafer to be tested, according to the site priority of the test items in individual test sheets, the creation time priority of individual test sheets, and machine amount, the machine type and the machine idle time of testing machines corresponding to individual batches.

Here, firstly, the manufacturing execution system submits a request for approval, to the machine according to individual test items in the test sheet, and receives the approval result fed back by the machine, to obtain the test condition of the testing machine corresponding to individual divided units, and stores in the database the test sequence condition of the test times in the individual test sheets and the test condition of testing machines corresponding to individual divided units. Before the tests are allocated to the corresponding machine, the test sequence of the test items to be performed on each wafer to be tested is calculated firstly.

Here, the test sequence condition comprises the site priority of the test items and the creation time priority of individual test sheet, wherein the site priority of the test items comprises the priority of the starting site and the priority of the ending site, and the priority of the starting site is sorted according to the site serial number corresponding to the starting site. For example, the smaller the site serial number is, the higher the priority is, and the larger the site serial number is, the lower the priority is. The priority of the ending site is sorted based on the site serial number corresponding to the ending site. For example, when the site serial number is smaller, the priority is higher, and the site serial number is larger, the priority is lower. The creation time priorities of individual test sheets are sorted based on the creation time of the test sheet. For example, the smaller the creation time is, the higher the priority is, and the larger the creation time is, the lower the priority is.

Here, the test condition comprises: the machine amount, the machine type, and the machine idle time, wherein, when the machine amount is greater than the preset machine amount, the machine amount satisfies the test condition: when the machine type meets the preset machine type, the machine type satisfies the test condition; and when the machine idle time is greater than or equal to the test time of the wafer to be tested, the machine meets the test condition.

In S104, the wafer to be tested is tested according to the test sequence of the test items to be performed on any of the wafers to be tested.

Further, in an optional embodiment, the step of testing the wafer to be tested according to the test sequence of the test items to be performed on any of the wafers to be tested comprises:

arranging sequentially the wafers to be tested to a testing machine of corresponding test item for being tested, according to the test sequence of the test items of any of the wafers to be tested.

Here, according to the test sequence of the test items of any wafer to be tested, the test sheet corresponding to individual test items in the test sequence is retrieved, and the wafer to be tested is transferred from the main process step according to the test sheet to the testing machine corresponding to the test item. What node in the main process starts the transferring is determined according to the step node of the main process corresponding to the starting site of the test sheet corresponding to the test item. After determining the node that the wafer to be tested is transferred from the main process to the test item, the test time of each test item corresponding to the wafer to be tested, and the node of the main process to which it returns after completing the test item are obtained. According to the test sequence of the test items, the wafer to be tested is transferred from the step node of the main process, and returned to the step node of the main process, after the test is completed within the test time.

Exemplarily, the test sequence of the test items to be performed on the wafer to be tested 01 is the test items 001 and 003, the test item 001 is the test item of the test sheet RC20211208012, and the test items 003 and 005 are the test items of the test sheet RC20211208013, the starting site of the test sheet RC20211208012 is TNOtest006, the ending site thereof is TNOtest006, and the test time thereof is 15 min. If the starting site of the test sheet RC20211208013 is TNOtest007, the ending site thereof is TNOtest008, and the test time thereof is 30 min, then in the order of the test items 001 and 003, the wafer to be tested 01 is transferred from the step node TNOtest006 of the main process to the testing machine corresponding to the 001 test item, during the test item 001 being executed, so as to perform the testing of 15 min. After completing the test, it returns to the main process at the step node TNOtest006 of the main process. When the test item 003 is executed, it leaves, at the step node TNOtest007 of the main process, to the testing machine corresponding to the test item 003, so as to perform the testing of 30 min; and after the test is completed, it returns to the main process at the step node TNOtest008 of the main process.

In the method for testing a wafer disclosed in this embodiment, plural test sheets are obtained: the wafers to be tested in the plurality of test sheets are divided according to individual test items in the plurality of test sheets, and the wafers to be tested corresponding to individual divided units are determined: a test sequence of the test items to be performed on each wafer to be tested is determined, based on a test sequence condition of the test items in individual test sheets and a test condition of a testing machine corresponding to individual divided units; and the wafer to be tested is tested according to the test sequence of the test items to be performed on any of the wafers to be tested. In this way, by arranging a better test sequence for the test items corresponding to individual wafers to be tested, the test efficiency of individual wafers can be improved.

Figure 2:
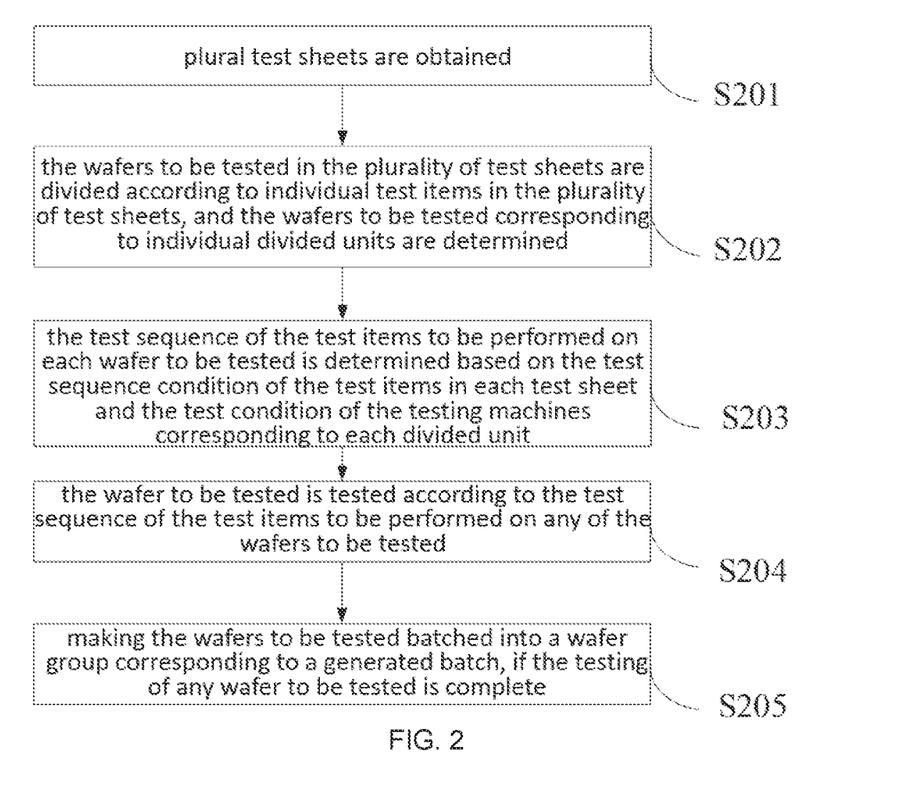
FIG. 2 shows a flowchart of another method for testing a wafer provided by an embodiment of the present disclosure.

Referring to FIG. 2, which is a flowchart of another method for testing a wafer provided by an embodiment of the present disclosure, the method comprises Steps S201-S205:

S201, obtaining plural test sheets;

S202, dividing the wafers to be tested in the plurality of test sheets according to individual test items in the plurality of test sheets, and determining the wafers to be tested corresponding to individual divided units;

S203, determining a test sequence of the test items to be performed on each wafer to be tested, based on a test sequence condition of the test items in individual test sheets and a test condition of a testing machine corresponding to individual divided units;

S204, testing the wafer to be tested, according to the test sequence of the test items to be performed on any of the wafers to be tested; and S205, making the wafers to be tested batched into a wafer group corresponding to a generated batch, if the testing of any wafer to be tested is complete. Here, when the testing of any wafer to be tested is complete, the wafers, which have been tested, are batched into the wafer group corresponding to the generated batch according to the test item identifier of the test item.

Here, the descriptions of Steps S201 to S204 may be obtained by referring to the descriptions of Steps S101 to S104, and the same technical effects can be achieved and the same technical problems are solved, which will not be repeated here.

In the method for testing a wafer disclosed in this embodiment, if the testing of any wafer to be tested is complete, the wafers to be tested are batched into the wafer group of corresponding generated batch, so that the wafers that have been tested are batched into one batch to ensure the integrity of wafers of the same batch.

Those skilled in the art can understand that in the above method of the embodiment, it does not mean that the order of the individual steps in the description is a strict execution order which constitutes any limitation on the implementation process, and the specific execution order of individual steps should be determined based on their function and possible internal logic.

Based on the same inventive concept, the embodiment of the present disclosure also provides a device for testing a wafer corresponding to the method for testing a wafer. Since the device in the embodiment of the present disclosure has the principle for solving problems, which is similar to that of the method for testing a wafer in the embodiment of the present disclosure, the device may be embodied by referring to the implementation of the method, which will not be repeated here.

Figure 3:
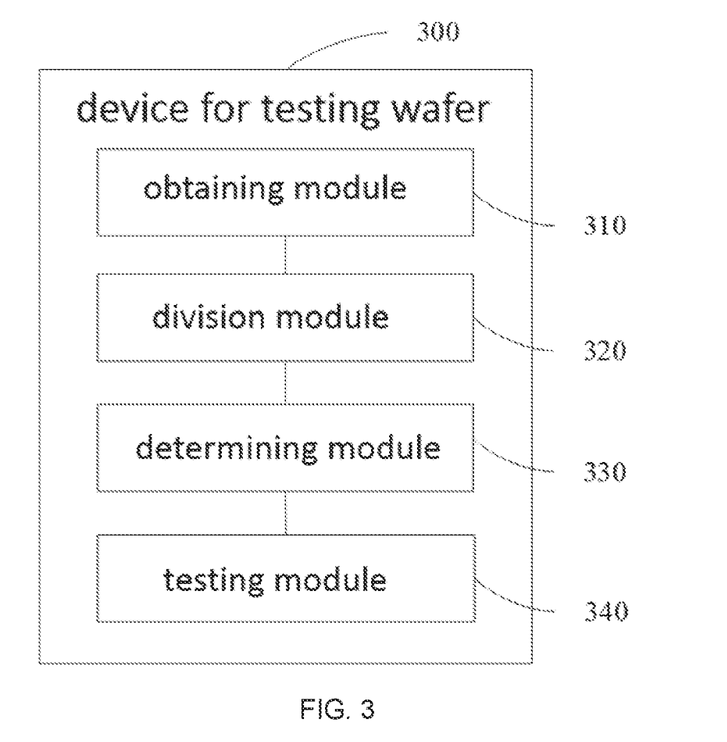
FIG. 3 shows the first schematic view of a device for testing a wafer provided by an embodiment of the present disclosure.
Figure 4:
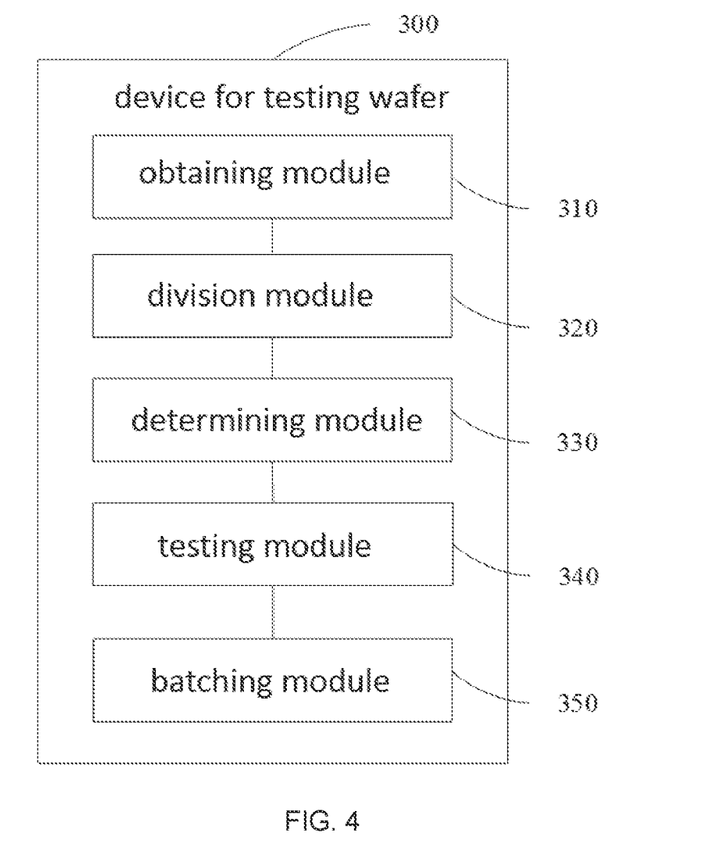
FIG. 4 shows the second schematic view of a device for testing a wafer provided by an embodiment of the present disclosure.

Referring to FIGS. 3 to 4, FIG. 3 is the schematic view of a device for testing a wafer provided by an embodiment of the present disclosure, and FIG. 4 is the second schematic view of a device for testing a wafer provided by an embodiment of the present disclosure. As shown in FIG. 3, the device 300 for testing a wafer provided by the embodiment of the present disclosure comprises:

an obtaining module 310, configured for obtaining plural test sheets, wherein each test sheet corresponds to at least one wafer to be tested and plural test items;

a division module 320, configured for dividing the wafers to be tested in the plurality of test sheets according to individual test items in the plurality of test sheets, and determining the wafers to be tested corresponding to individual divided units, wherein the test items of the wafers to be tested corresponding to a same divided unit are the same;

a determining module 330, configured for determining a test sequence of the test items to be performed on each wafer to be tested, based on a test sequence condition of the test items in individual test sheets and a test condition of a testing machine corresponding to individual divided units; and a testing module 340, configured for testing the wafer to be tested, according to the test sequence of the test items to be performed on any of the wafers to be tested. In an optional embodiment, the obtaining module 310 generates any test sheet in the following manner:

obtaining batch information and test main process information of the wafer to be tested corresponding to any production batch;

obtaining site information of a test sheet, wafer identifier of the wafer to be tested in the test sheet, and a test items of the test sheet, set by an user, according to the batch information and the test main process information; and generating the test sheet of the wafer to be tested corresponding to the production batch, according to the site information, the wafer identifier and the test items corresponding to the production batch.

In an optional embodiment, the division module 320 is specifically configured for:

determining the wafers to be tested in the plural test sheets corresponding to the item identifier, according to the item identifier of any test item; and dividing the wafers to be tested corresponding to each test item, into a same unit.

In an optional embodiment, the test sequence condition comprise: a site priority of the test item, and a creation time priority of individual test sheets, and the test condition comprises: the machine amount, the machine type, and the machine idle time. The determining module 330 is specifically configured for:

using a sorting function to generate a test sequence of the test items of each wafer to be tested, according to the site priority of the test items in individual test sheets, the creation time priority of individual test sheets, and the machine amount, the machine type and the machine idle time of testing machines corresponding to individual batches.

In an optional embodiment, the testing module 340 is specifically configured for:

arranging sequentially the wafers to be tested to a testing machine corresponding to the test item for being tested, according to the test sequence of the test items of any of wafers to be tested.

In an optional embodiment, the device further comprises a batching module 350, and the batching module 350 is configured for:

making the wafers to be tested batched into a wafer group corresponding to a generated batch, if the testing of any wafer to be tested is complete.

The description of the processing process of individual modules in the device and the interaction process between the individual modules may be obtained by referring to the relevant descriptions in the foregoing method embodiments, which will not be described in detail here.

In the device for testing a wafer disclosed in the embodiment of the present disclosure, it comprises: an obtaining module, configured for obtaining plural test sheets; a division module, configured for dividing the wafers to be tested in the plurality of test sheets according to individual test items in the plurality of test sheets, and determining the wafers to be tested corresponding to individual divided units: a determining module, configured for determining a test sequence of the test items to be performed on each wafer to be tested, based on a test sequence condition of the test items in individual test sheets and a test condition of a testing machine corresponding to individual divided units; and a testing module, configured for testing the wafer to be tested, according to the test sequence of the test items to be performed on any of the wafers to be tested. In this way, by arranging a better test sequence for the test items corresponding to individual wafers to be tested, the test efficiency of individual wafers can be improved.

Figure 5:
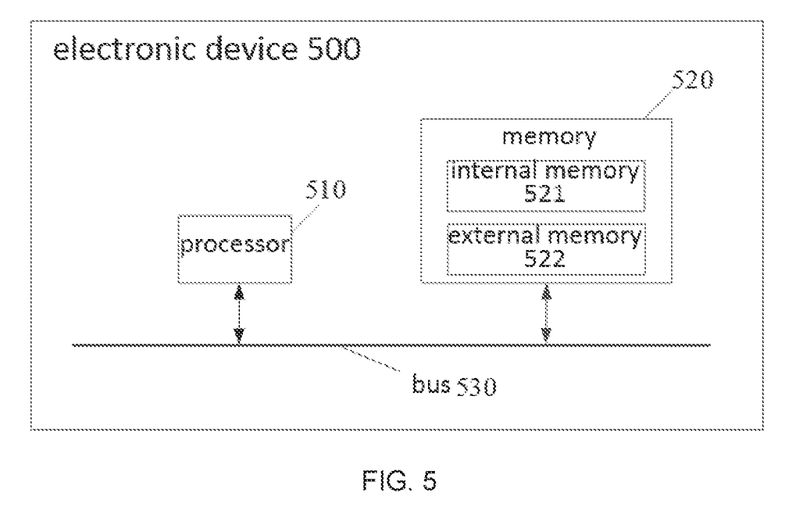
FIG. 5 shows a schematic view of the electronic device provided by an embodiment of the present disclosure.

Based on the same technical concept, the embodiments of the present disclosure also provide an electronic device. An embodiment of the present disclosure also provides an electronic device 500. As shown in FIG. 5, it is a schematic structural diagram of the electronic device 500 provided by the embodiment of the present disclosure, comprising:

a processor 510, a memory 520, and a bus 530, wherein the memory 520 is used to store the execution instructions, comprising the internal memory 521 and the external memory 522. Here, the internal memory 521 is also called as the internal memory device, and used to temporarily store the operation data in the processor 510, and the data exchanged with the external memory 522 such as the hard disk. The processor 510 exchanges data with the external memory 522 through the internal memory 521. When the electronic device 500 is running, the processor 510 communicates with the memory 520 through the bus 530, such that the processor 510 can execute the steps of the method for testing a wafer provided in the above method embodiments.

Embodiments of the present disclosure further provide a computer storage medium, wherein a computer program is stored on the computer storage medium, wherein when the computer program is run by a processor, the steps of the method for testing a wafer described in the above method embodiments are executed. Here, the storage medium may be a volatile or non-volatile computer-readable storage medium.

Embodiments of the present disclosure further provide a computer program product, wherein the computer program product carries program codes, and the instructions contained in the program codes can be used to execute the steps of the method for testing a wafer described in the foregoing method embodiments. The foregoing method embodiments may be referred to for more details, which is not repeated here.

Herein, the above-mentioned computer program product can be specifically implemented by means of hardware, software or a combination thereof. In an optional embodiment, the computer program product is embodied as a computer storage medium. In another optional embodiment, the computer program product is embodied as a software product, such as, a software development kit (SDK), etc.

Those skilled in the art can clearly understand that, for the convenience and brevity of description, the specific working process of the electronic device, the storage medium and the device described above may be obtained by referring to the corresponding process in the foregoing method embodiments, which will not be repeated here. In the embodiments provided by the present disclosure, it should be understood that the disclosed electronic device, the storage medium, the device and the method may be implemented in other manners. The device embodiments described above are only illustrative. For example, the division of the units is only a logical functional division. In actual implementation, there may be other division methods. Again, for example, plural units or components may be combined or integrated into another system, or some features can be ignored, or not implemented. On the other hand, the shown or discussed mutual coupling or direct coupling or communicating connection may be the indirect coupling or communicating connection through some communicating interfaces, devices or units, which may be in electrical, mechanical or in other forms.

The unit described as a separate component may or may not be physically separated, and the components displayed as a unit may or may not be a physical unit, that is, may be located in one place, or may be allocated to plural units on the network. Some or all of the units may be selected according to actual need, to achieve the purpose of the technical solution in this embodiment.

In addition, individual functional units in the individual embodiments of the present disclosure may be integrated into one processing unit, or the individual units may exist physically alone, or two or more units may be integrated into one unit.

The functions, if implemented in the form of the software functional unit and sold or used as an independent product, may be stored in a processor-executable non-volatile computer-readable storage medium. Based on this understanding, the technical solution of the present disclosure can be embodied in the form of a software product in essence, or the part of the technical solution that contributes to the prior art or the part of the technical solution can be embodied in the form of a software product. The computer software product is stored in a storage medium, including plural instructions, which are used to cause a computer device (which may be a personal computer, a server, or a network device, etc.) to execute all or part of the steps of the methods described in the various embodiments of the present disclosure. The aforementioned storage medium comprises: U disk, mobile hard disk, read-only memory (ROM), random access memory (RAM), magnetic disk or optical disk and other media that can store program codes.

Finally, it should be noted that the above-mentioned embodiments are only specific embodiments of the present disclosure, and they are used to illustrate the technical solutions of the present disclosure, but not to limit the present disclosure. The protection scope of the present disclosure is not limited to them. Although the present disclosure has been described in detail referring to the foregoing embodiments, those skilled in the art should understand that: any person skilled in the art who is familiar with the technical field, within the technical scope disclosed by the present disclosure, can still modify the technical solutions described in the foregoing embodiments, or easily conceive of changes or make equivalent replacements to some of the technical features. These modifications, changes or replacements do not make the essence of the corresponding technical solutions deviate from the spirit and scope of the technical solutions of the embodiments of the present disclosure, all of which should be covered by the protection scope of the present disclosure. Therefore, the protection scope of the present disclosure should be based on the protection scope of the claims.

What is claimed is:

1. A method for testing a wafer, the method comprising steps of: by one or more processors, obtaining plural test sheets, wherein each test sheet corresponds to at least one wafer to be tested and plural test items; by one or more processors, dividing wafers to be tested in the plural test sheets according to individual test items in the plural test sheets, and determining wafers to be tested corresponding to individual divided units, wherein test items of wafers to be tested corresponding to a same divided unit are the same; by one or more processors, determining a test sequence of test items to be performed on each wafer to be tested, based on a test sequence condition of the test items in individual test sheets and a test condition of a testing machine corresponding to individual divided units; and by one or more processors, testing the wafer to be tested, according to the test sequence of test items to be performed on any of the wafers to be tested, wherein the test sequence condition comprises: a site priority of test items, and a creation time priority of individual test sheets, and the test condition comprises: machine amount, machine type, and machine idle time; and the step of determining the test sequence of test items to be performed on each wafer to be tested, based on the test sequence condition of the test items in individual test sheets and the test condition of a testing machine corresponding to individual divided units comprises: using a sorting function to generate the test sequence of the test items of each wafer to be tested, according to the site priority of the test items in individual test sheets, the creation time priority of individual test sheets, and the machine amount, the machine type and the machine idle time of the testing machine corresponding to individual batches.

2. The method according to claim 1, wherein any of the test sheets is generated in following manner:
obtaining batch information and test main process information of a wafer to be tested corresponding to any production batch;
obtaining site information of the test sheet, a wafer identifier of the wafer to be tested in the test sheet, and test items of the test sheet, set by an user, according to the batch information and the test main process information; and
generating the test sheet of the wafer to be tested corresponding to the production batch, according to the site information, the wafer identifier and the test items corresponding to the production batch.

3. The method according to claim 1, wherein the step of dividing wafers to be tested in the plural test sheets according to individual test items in the plural test sheets, and determining wafers to be tested corresponding to individual divided units comprising:
  determining the wafers to be tested in the plural test sheets corresponding to an item identifier, according to the item identifier of any test item; and
  dividing wafers to be tested corresponding to each test item, into a same unit.

4. The method according to claim 2, wherein the step of testing a wafer to be tested, according to the test sequence of test items to be performed on any of the wafers to be tested comprises:
  arranging sequentially the wafers to be tested to the testing machine corresponding to the test items for being tested, according to the test sequence of the test items of any of the wafers to be tested.

5. The method according to claim 1, further comprising: making a wafer to be tested batched into a wafer group corresponding to a generated batch, if testing of any wafer to be tested is complete.

6. An electronic device, comprising:
  a processor, a memory, and a bus, wherein the memory stores machine-readable instructions executable by the processor, wherein when the electronic device is running, the processor and the memory communicate with each other through the bus, and the machine-readable instructions, when being executed by the processor, perform steps of the method for testing a wafer according to claim 1.

7. A device for testing a wafer, the device comprising: an obtaining module, configured to obtain plural test sheets, wherein each test sheet corresponds to at least one wafer to be tested and plural test items;
  a division module, configured to divide wafers to be tested in the plural test sheets according to individual test items in the plural test sheets, and determine wafers to be tested corresponding to individual divided units, wherein test items of wafers to be tested corresponding to a same divided unit are the same;
  a determining module, configured to determine the test sequence of test items to be performed on each wafer to be tested, based on a test sequence condition of the test items in individual test sheets and the test condition of a testing machine corresponding to individual divided units; and
  a testing module, configured to test a wafer to be tested, according to the test sequence of test items to be performed on any of the wafers to be tested;
  wherein the test sequence condition comprises: a site priority of test items, and a creation time priority of individual test sheets, and the test condition comprises: machine amount, machine type, and machine idle time; and the determining module is configured to:
    use a sorting function to generate the test sequence of the test items of each wafer to be tested, according to the site priority of the test items in individual test sheets, the creation time priority of individual test sheets, and the machine amount, the machine type and the machine idle time of the testing machine corresponding to individual batches.

8. The device according to claim 7, wherein the obtaining module generates any test sheet in following manner:
  obtaining batch information and test main process information of a wafer to be tested corresponding to any production batch;
  obtaining site information of a test sheet, the wafer identifier of the wafer to be tested in the test sheet, and test items of the test sheet, set by an user, according to the batch information and the test main process information; and
  generating the test sheet of the wafer to be tested corresponding to the production batch, according to the site information, the wafer identifier and the test items corresponding to the production batch.

* * * * *